(12) United States Patent
Huang et al.

(10) Patent No.: US 7,885,799 B2
(45) Date of Patent: Feb. 8, 2011

(54) METHOD FOR BUILDING MOS TRANSISTOR MODEL AND METHOD FOR VERIFYING MOS TRANSISTOR MODEL

(75) Inventors: Juncheng Huang, Shanghai (CN); Fangfang Zhao, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 333 days.

(21) Appl. No.: 11/945,991

(22) Filed: Nov. 27, 2007

(65) Prior Publication Data
US 2008/0319721 A1 Dec. 25, 2008

(30) Foreign Application Priority Data
Jun. 22, 2007 (CN) .................. 2007 1 0042459

(51) Int. Cl.
*G06F 17/50* (2006.01)
(52) U.S. Cl. .................................................. 703/13
(58) Field of Classification Search .................. 703/13
See application file for complete search history.

(56) References Cited

U.S. PATENT DOCUMENTS 6,693,439 B1 * 2/2004 Liu et al. .................. 324/613

OTHER PUBLICATIONS

Klimach et al. Characterization of MOS Transistor Current Mismatch. [online] Sep. 2004 [retrieved on Dec. 11, 2009] ACM Database.*
Arnaud et al. A compact Model for Flicker Noise in MOS Transisors for Analog Circuit Design. [online] 2003 [retrieved on Dec. 11, 2009] IEEE Database.*

\* cited by examiner

*Primary Examiner*—Hugh Jones
(74) *Attorney, Agent, or Firm*—Squire, Sanders & Dempsey L.L.P.

(57) ABSTRACT

The present invention discloses a method for building an MOS transistor model enclosing statistical variation of noise, including: measuring noise in MOS transistors from different dies; creating a noise distribution diagram in accordance with the obtained noise data of the MOS transistors; adding a variation of noise parameter in at least one noise model file into a library file of MOS transistor to simulate noise in MOS transistors; if a simulation result does not cover the noise data in the noise distribution diagram, changing the variation of the noise parameter until the simulation result covers the noise data in the noise distribution diagram; if the simulation result covers the noise data in the noise distribution diagram, adding corresponding variation of the noise parameter into the library file of MOS transistor as the MOS transistor model enclosing statistical variation of noise. The model obtained by the present invention is more precise.

12 Claims, 10 Drawing Sheets

```
********************
*  MOS Corner model
********************
.LIB TT
.PARAM
*1.2V  NMOS
+DNOIB_N12      = 0                 DEM_N12      = 0
*1.2V  PMOS
+DNOIB_P12      = 0                 DEM_P12      = 0
.INC '1013_noi.mdl'
.ENDL  TT
.LIB FF
.PARAM
*1.2V  NMOS
+DNOIB_N12      = 3e+4              DEM_N12      = 5e+6
*1.2V  PMOS
+DNOIB_P12      = 9.62E+6           DEM_P12      = 6.33E+6
.INC '1013_noi.mdl'
.ENDL  FF
.LIB SS
.PARAM
*1.2V  NMOS
+DNOIB_N12      = -3e+4             DEM_N12      = -5e+6
*1.2V  PMOS
+DNOIB_P12      = -9.62E+6          DEM_P12      = -6.33E+6
.INC '1013_noi.mdl'
.ENDL  SS
.LIB FNSP
.PARAM
*1.2V  NMOS
 DNOIB_N12      = 3e+4              DEM_N12      = 5e+6
*1.2V  PMOS
+DNOIB_P12      = -9.62E+6          DEM_P12      = -6.33E+6
.INC '1013_noi.mdl'
.ENDL  FNSP
.LIB SNFP
.PARAM
*1.2V  NMOS
+DNOIB_N12      = -3e+4             DEM_N12      = -5e+6
*1.2V  PMOS
+DNOIB_P12      = 9.62E+6           DEM_P12      = 6.33E+6
.INC '1013_noi.mdl'
.ENDL  SNFP
```

METHOD FOR BUILDING MOS TRANSISTOR MODEL AND METHOD FOR VERIFYING MOS TRANSISTOR MODEL

This application claims the priority of Chinese Patent Application No. 200710042459.8, filed Jun. 22, 2007, the entire disclosure of which is incorporated herein by reference.

FIELD OF THE INVENTION

The present invention relates to a method for building an MOS transistor model and a method for verifying an MOS transistor model. In particular, the present invention relates to a method for building an MOS transistor model enclosing statistical variation of noise and a method for verifying an MOS transistor model.

BACKGROUND OF THE INVENTION

Currently, devices in a circuit may typically give rise to various noises. For studying the regularity of noise, research is generally made on MOS transistor. The MOS transistor may be considered as a micro circuit, including various resistors, capacitors and active devices. For MOS transistor, thermal noise on gate, source and drain, thermal noise and 1/f noise in channel, thermal noise on substrate and inductive noise on the gate, etc. may be involved. The 1/f noise is generally a low frequency noise, and is called like this because the noise increases in inverse proportion to the frequency. The 1/f noise primarily influences devices operating in a low frequency environment. However in some radio frequency circuits, such as frequency mixer, amplifier and frequency divider, etc., the 1/f noise has an increasing influence in high frequency band, and may result in a deteriorated signal-to-noise rate and the like. For circuit design and analysis, it is rather important to have a model that can simulate the noise precisely.

Generally, a conventional device modeling method includes: analyzing obtained data; finding regularity from the data, e.g. a variation according to a voltage or a current; and then finding an equation to describe the regularity with mathematic method. For instance, in a document entitled *Device Modeling for Analog and RF CMOS Circuit Design*, ISBN 0-471-49869-6, there has been disclosed a model of noise in MOS transistor, which takes some current parameters as primary related factors of noise. For instance, a quadratic drain current is taken as a primary related factor of the 1/f noise in channel of the MOS transistor, and is adapted to construct an equation for describing the variation regularity of the 1/f noise in combination with other factors, such as frequency, capacitance of gate oxidization layer per unit area, channel length, etc., In the circuit design and analysis, some simulation software, such as HSPICE, may be used to simulate noise in the MOS transistor under direct current, alternating current, small signal and instantaneous analysis, etc. The MOS transistor model contained in the simulation software is an MOS transistor library files including noise model files. For noise simulation, noise parameter in the equation for describing noise and variation of the noise parameter configured in a library file generally determine the accuracy of the noise simulation. Thus, in the noise simulation, some noise parameters can be determined from the MOS transistor to be simulated, such as the channel length, while the variation of the noise parameter configured in the library, for instance, are experiential values obtained from practical measurements. At present, most of these experiential values are based upon some measurement data without considering various factors in process. For example, gate oxide growth may cause difference in noise among different wafers, different dies and different runs. When a circuit designer needs to use a MOS transistor noise model to simulate noise for aiding the design, the designer is unable to determine whether the model for the simulation of the noise is sufficiently precise or not, and the design quality may be influenced if a noise model which is not sufficiently precise is applied.

SUMMARY OF THE INVENTION

The present invention addresses a problem in the prior art that a conventional MOS transistor model does not consider the variation of noise character, and hence may not be precise sufficiently.

The present invention also addresses another problem that whether a model for noise simulation is precise can not be determined during design.

To solve the above problems, the present invention provides a method for building an MOS transistor model enclosing statistical variation of noise, including:
  measuring noise in MOS transistors on different dies;
  creating a noise distribution diagram in accordance with the obtained noise data of the MOS transistors;
  adding a variation of noise parameter in at least one noise model file into a library file of MOS transistor to simulate noise in MOS transistors;
  if a simulation result does not cover the noise data in the noise distribution diagram, then continuously changing the variation of the noise parameter until the simulation result covers the noise data in the noise distribution diagram; and
  if the simulation result covers the noise data in the noise distribution diagram, then adding corresponding variation of the noise parameter into the library file of MOS transistor as the MOS transistor model enclosing statistical variation of noise.

To solve the above problems, the present invention further provides a method for verifying an MOS transistor model, including:
  measuring noise in MOS transistors on different dies;
  creating a noise distribution diagram in accordance with the obtained noise data of the MOS transistors;
  using a library file of the MOS transistors, containing a noise model file, as a noise simulation model of the MOS transistors to simulate the noise;
  if a simulation result does not cover noise data in the noise distribution diagram, then determining that the MOS transistor model is unable to simulate the noise precisely; and
  if the simulation result covers the noise data in the noise distribution diagram, then determining that the MOS transistor model is able to simulate the noise precisely.

The present invention provides the following advantages over the prior art:

1. In accordance with the method for building an MOS transistor model enclosing statistical variation of noise according to the present invention, the measured noise of MOS transistors from different dies is taken as original data and a distribution diagram is created to describe a statistical distribution of noise, wherein, the difference in noise character is considered. Since the data in the noise distribution diagram will finally be covered with the simulation value of the noise, the built model can implement a realistic simulation and hence be more precise.

2. In accordance with the method for verifying an MOS transistor model according to the present invention, the measured noise of MOS transistors from different dies is takes as original data, a distribution diagram is created to describe a statistical distribution of noise, the difference in noise character is considered and the difference is used as a criteria for evaluating the precision of a noise model, so that the method may be more accurate.

DETAILED DESCRIPTIONS OF THE EMBODIMENTS

In accordance with the method for building an MOS transistor model enclosing statistical variation of noise according to the present invention, the measured noise is taken as original data and a distribution diagram is created to describe a statistical distribution of noise. When data in the noise distribution diagram is covered with simulation values of the noise, the model is built.

In accordance with the method for verifying an MOS transistor model according to the present invention, the measured noise of MOS transistors from different dies is taken as original data and a distribution diagram is created to describe a statistical distribution of noise, the difference in noise character is considered and the difference is used as a criteria for evaluating the precision of a noise model.

As mentioned above, the noise of an MOS transistor may be divided into numerous categories. Hereinafter, there will be given of descriptions of steps for modeling a noise to make the method for building a noise model according to the present invention more apparent.

Figure 1:
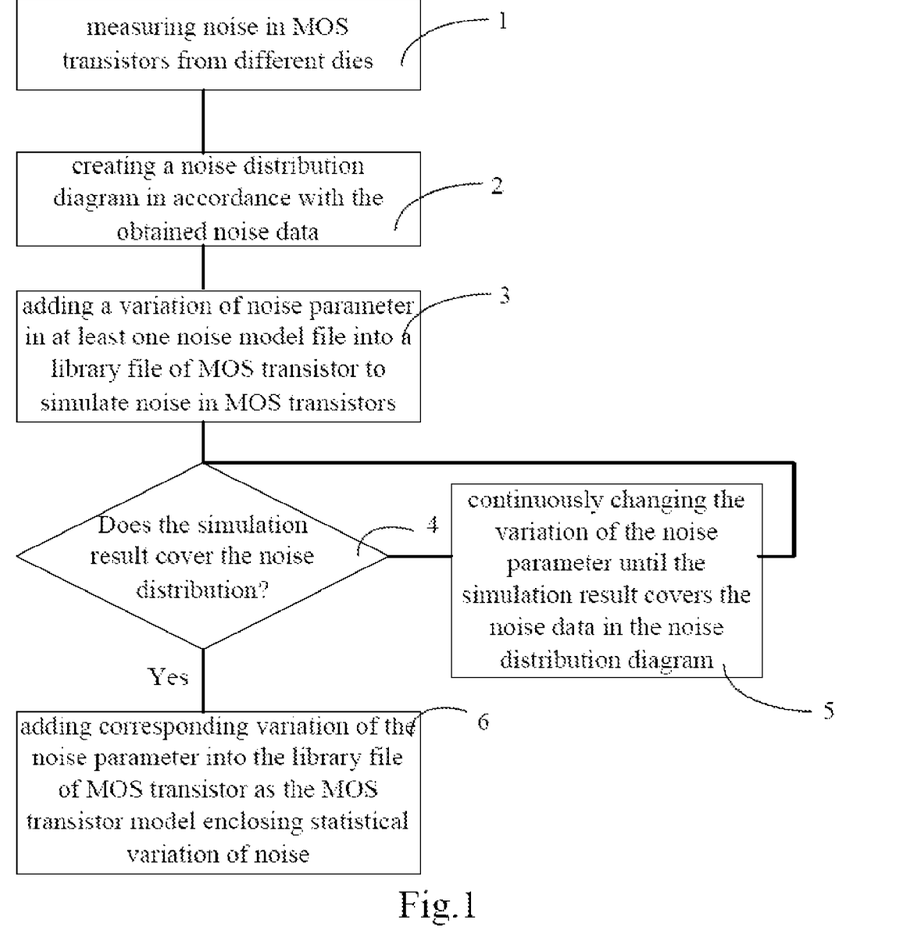
FIG. 1 is a flow chart of a method for building an MOS transistor model enclosing statistical variation of noise according to the present invention.

Referring to FIG. 1, a method for building an MOS transistor model enclosing statistical variation of noise according to the present invention includes the following steps.

In step 1, noise in MOS transistors from different dies are measured. Typically, the noise can be roughly divided into two categories in terms of their behaviors, i.e., voltage noise and current noise. Consequently, the measurement of a noise often involves the two noises. An influence of a noise can be obtained through a measurement of either noise voltage or noise current.

The present embodiment will be described in details with respect to steps of building an MOS transistor model enclosing statistical variation of noise. Therefore, a measurement starts from an electrode of an MOS transistor, and the influence of the noise can be obtained through a measurement of a noise current. For the purpose of noise distribution, a selection of a measurement point is different from conventional method. In this embodiment, MOS transistors from different dies of different wafers are selected as measurement objects. Due to a variation of the fabrication process, even MOS transistors from different dies on the same wafer may have different performances, let alone those on different wafers. A benefit of the selection of MOS transistors is to cover sufficiently the process variation, so that measured data can represent the discrete differences of MOS transistor performances.

A step of measuring the 1/f noise of MOS transistors in this embodiment is as following. Firstly, NMOS transistors, with a channel width of 10 μm and a channel length of 0.13 μm, from 20 dies of different wafers are selected for the measurement. The 20 dies may be 4 dies selected respectively from 5 wafers, or be 2 dies selected respectively from 10 wafers, thus covering sufficiently the process variation, as mentioned above.

Then, a certain bias voltage is applied to the MOS transistors to be measured. As well known by those skilled in the art, an MOS transistor in different bias voltages may have different electric behaviors, and thus noise may vary as the bias voltage varies. For an MOS transistor, there are three operating modes dependent upon different bias voltages, a cut-off region, a linear region, and a saturated region. Taking an NMOS transistor as an example, when a gate-source voltage of the NMOS transistor is less than a threshold voltage of the NMOS transistor, a controlled region between a source and a drain of the NMOS transistor is depleted, no carrier flows in a channel, and the NMOS transistor is cut off. When the gate-source voltage of the NMOS transistor is larger than the threshold voltage of the NMOS transistor, middle band gap energy of a surface of the NMOS transistor is below a Fermi energy level, resulting in that a positive surface potential and a surface inversion. Once an inversed layer is established at the surface, an n-type channel capable of conducting a drain current will be formed between the source and the drain. At this time, when a drain-source voltage is zero, a thermal balance is present in the inversed channel region, and the drain current is zero, while when the drain-source voltage is large than zero, the conductive region between the source and the drain conducts the drain current in proportion to the drain-source voltage. The channel forms a continuous current path between the source and the drain, and the NMOS transistor operates in the linear region. However as the drain voltage increases, charges and a channel depth at the inversed layer of the drain begin to reduce. Finally, when the drain-source voltage equals to a drain-source saturation voltage, the charges at the inversed layer of the drain reduce to zero, which is called a clamp-off point. At this time, a depleted surface region is formed in adjacent drain and as the drain voltage increases, the depleted region begins to extend to the source, and the NMOS transistor operates in the saturated region. In an actual measurement of the noise, different bias voltage for the measurement shall be set respectively in the linear region and the saturated region in order to make the measurement data comprehensive. For brief descriptions, the embodiment takes as an example of a bias voltage which makes the MOS transistor operate in the saturated region. The bias voltage is set so that the gate-source voltage is 1.5V, the drain-source voltage is 1.5V, and a base-source voltage is 0V, and at a frequency of 4 Hz, through the above mentioned method in which the quadric drain current is taken as a primary relevant factor of the 1/f noise in the channel of the MOS transistor, a fluctuation of the drain current in the NMOS transistor is measured as a drain current noise power spectral density (Sid) of the NMOS transistor to indicate the 1/f noise.

Figure 2:
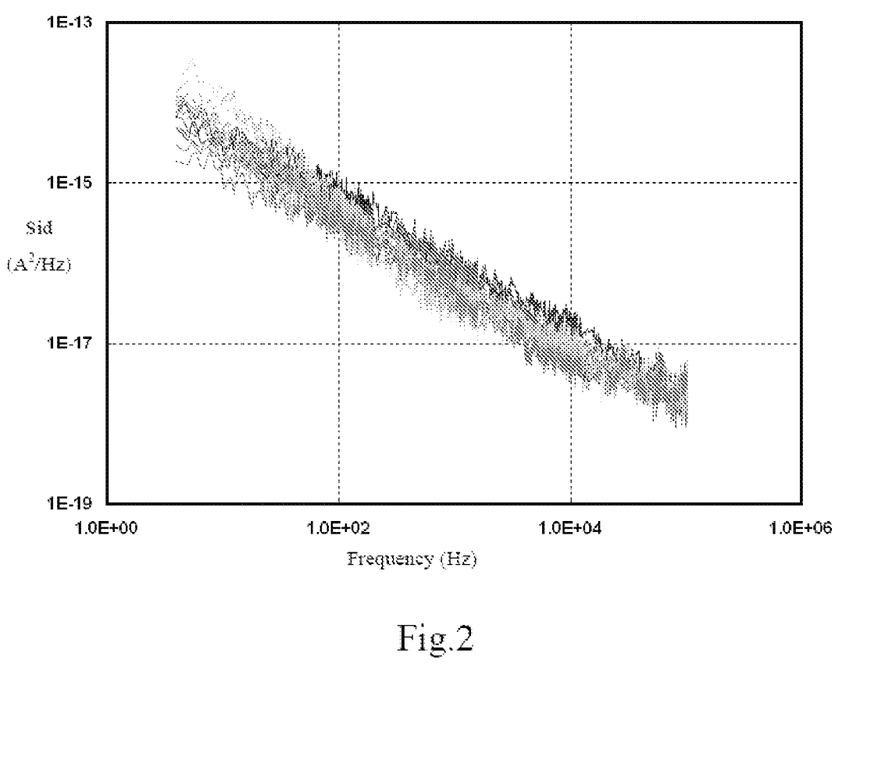
FIG. 2 is a diagram showing a relationship between the 1/f noise and a frequency for an NMOS transistor obtained according to an embodiment of the invention.

Thereafter, maintaining the same bias voltage of the NMOS transistor, a frequency is changed to obtain the 1/f noise of the NMOS transistor at different frequencies and the frequency ranges from 4 Hz to 100 kHz. Next, the measured NMOS transistor is replaced with a NMOS transistor from another die as the measurement object, and a corresponding 1/f noise is obtained while keeping the same bias voltage as well as within the frequency range of 4 Hz to 100 kHz. With an abscissa indicating a frequency and an ordinate indicating the measured drain current noise power spectral densities of the NMOS transistors from 20 different dies, a relationship graph is plotted in which the 1/f noise of the NMOS transistor varies as a function of the frequency. FIG. 2 shows the relationship.

In further words, the number of the dies and the channel width and length of the MOS transistors selected in the above measurement of the 1/f noise may be selected as desired in practice. For instance, a larger number of selected dies will lead to a wider range of measured data and a relatively more precise model to be established. Naturally, other bias voltage may also be set for the measurement of the 1/f noise of the NMOS transistor. For instance, when measuring the 1/f noise of the NMOS transistor operating in the linear region, the gate-source voltage is 0.8V, the drain-source voltage is 0.3V, and the base-source voltage is 0V; and when measuring the 1/f noise of an NMOS transistor operating in the saturated region, the gate-source voltage is 1.2V, the drain-source voltage is 1.2V, and the base-source voltage is 0V.

Next, with reference to the above method for measuring the 1/f noise of the NMOS transistor, PMOS transistors, with a channel width of 10 μm and a channel length of 0.13 μm, from 20 dies on different wafers are selected as measurement objects, and a bias voltage is applied to each PMOS transistor. Wherein the gate-source voltage is −1.5V, the drain-source voltage is −1.5V, and the base-source voltage is 0V, and the PMOS transistor operates in the saturated region. At a frequency of 4 Hz, a fluctuation of the drain current in the PMOS transistor is measured to obtain the Sid of the PMOS transistor to indicate the 1/f noise.

Figure 5:
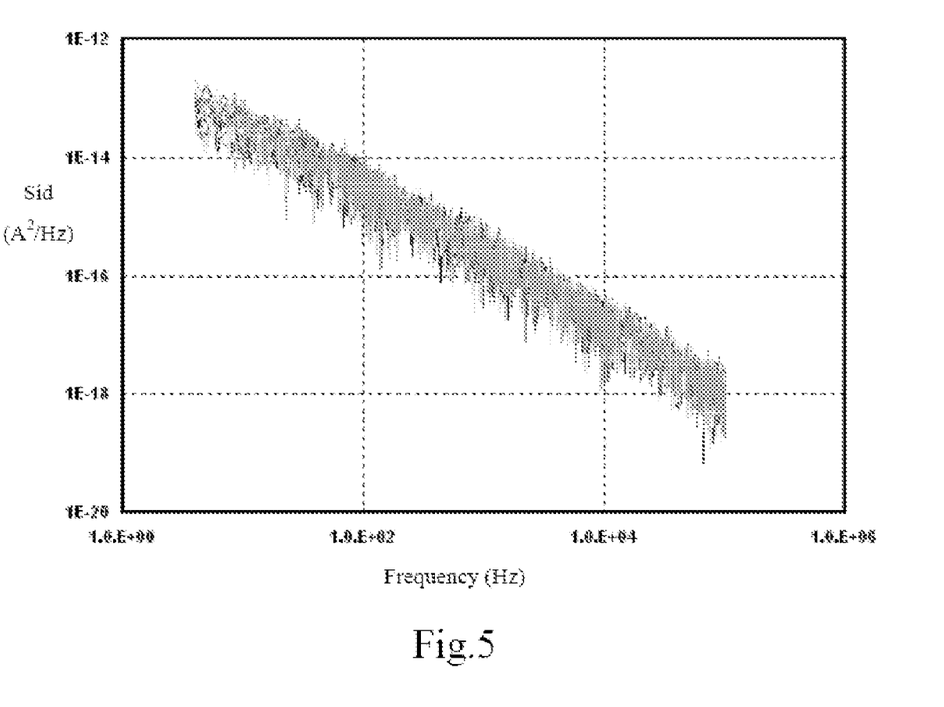
FIG. 5 is a graph showing a relationship between the 1/f noise and a frequency of a PMOS transistor obtained according to an embodiment of the invention.

Thereafter, keeping the same bias voltage of the PMOS transistor, a frequency is changed to obtain the 1/f noise of the PMOS transistor at different frequencies and the frequency ranges from 4 Hz to 100 kHz. Next, the measured PMOS transistor is replaced with a PMOS transistor from another die as a measurement object, and a corresponding 1/f noise is obtained while keeping the same bias voltage as well as being within the frequency range of 4 Hz to 100 kHz. With an abscissa indicating a frequency and an ordinate indicating the measured SIPs of the PMOS transistors from 20 different dies, a relationship graph is plotted in which the 1/f noise of a PMOS transistor varies as a function of the frequency. FIG. 5 shows the relationship.

Naturally, other bias voltage may be set for the measurement of the 1/f noise of the PMOS transistor. For instance, when measuring the 1/f noise of the PMOS transistor operating in the linear region, the gate-source voltage is −0.8V, the drain-source voltage is −0.3V, and the base-source voltage is 0V; and when measuring the 1/f noise of the PMOS transistor operating in the saturated region, the gate-source voltage is −1.2V, the drain-source voltage is −1.2V and the base-source voltage is 0V.

Figure 3:
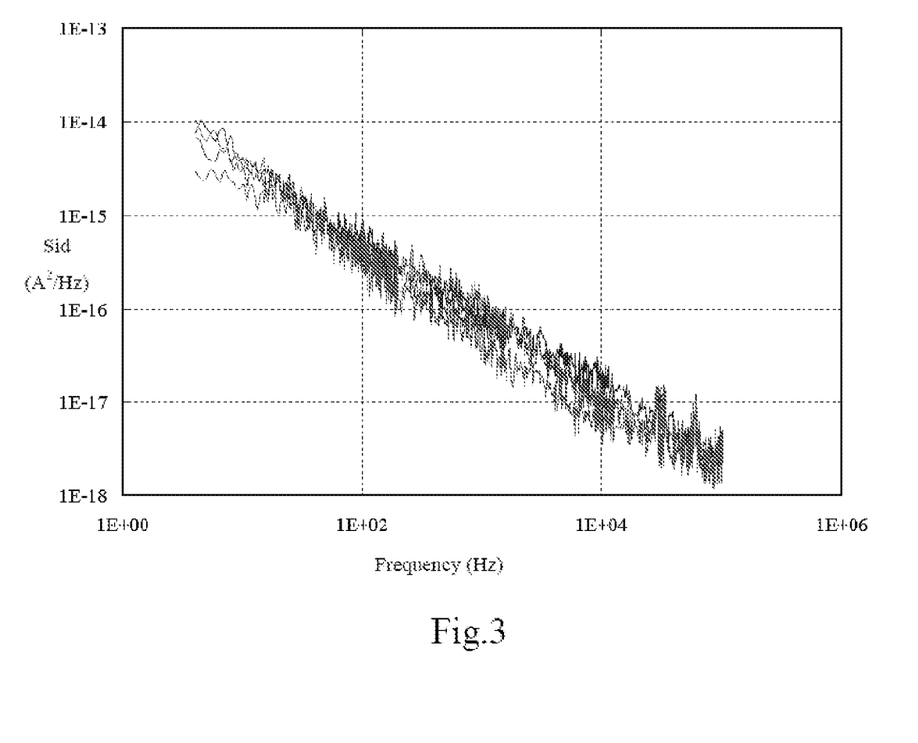
FIG. 3 is a graph showing four relationships between the 1/f noise and the frequency, as selected from FIG. 2.
Figure 4:
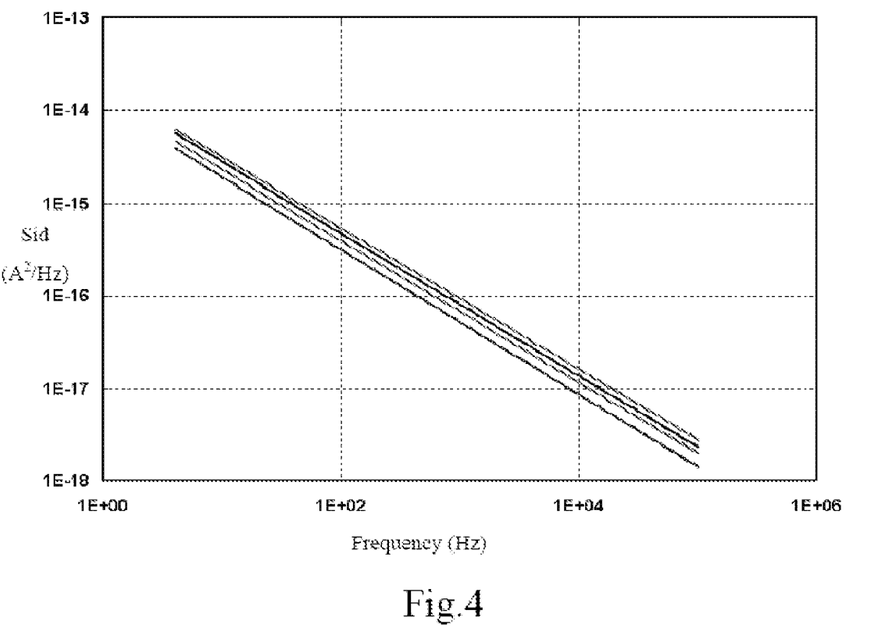
FIG. 4 is a graph showing a data trend line of FIG. 3.
Figure 6:
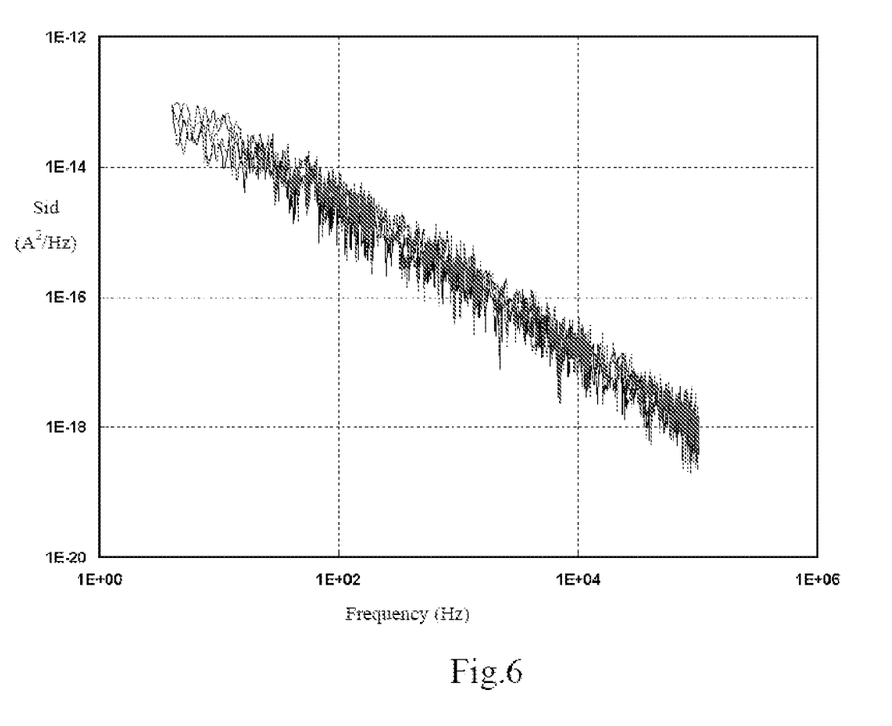
FIG. 6 is a graph showing four relationships between the 1/f noise and a frequency, as selected from FIG. 5.
Figure 7:
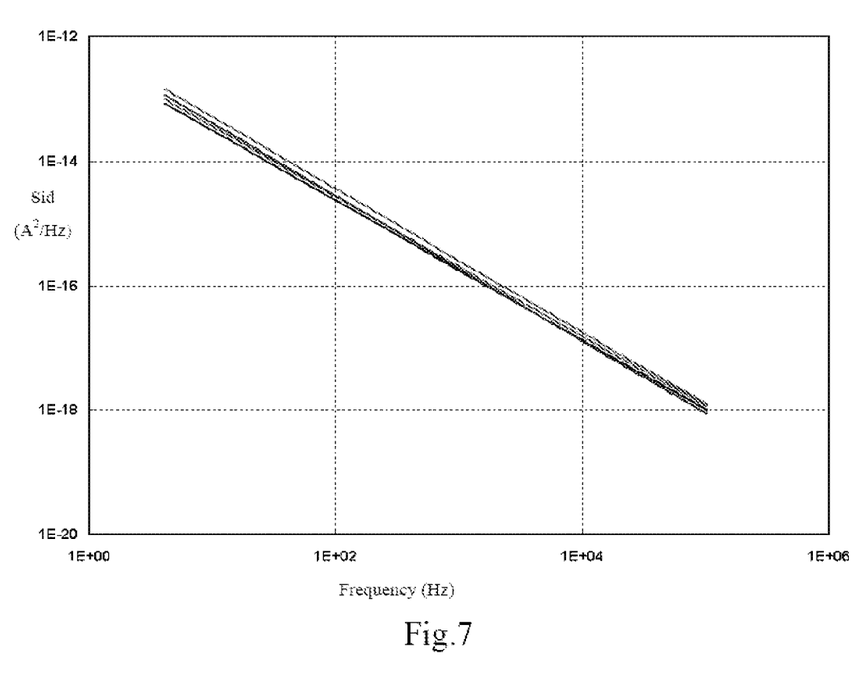
FIG. 7 is a graph showing a data trend line of FIG. 6.

In step 2, a noise distribution graph is established based on the obtained noise of the MOS transistors. In this embodiment, from the measurement step of step 1, 20 relationship curves in which the 1/f noise of an NMOS transistor varies as a function of the frequency, and 20 relationship curves in which the 1/f noise of a PMOS transistor varies as a function of the frequency are obtained, respectively. In order to make FIG. 2 and FIG. 5 more apparent, 4 curves are selected randomly from FIG. 2 and FIG. 5, respectively, thus graphs as illustrated in FIG. 3 and FIG. 6 are obtained. Further, a trend curve is extracted from the curves in the two figures, and FIG. 4 and FIG. 7 are obtained. As can be seen from a combination of FIG. 2, FIG. 3 and FIG. 4, slopes of the relationship graphs of the respective NMOS transistors are almost identical, and as can be seen from a combination of FIG. 5, FIG. 6 and FIG. 7, slopes of the relationship graphs of the respective PMOS transistors are also almost identical. The slope indicates that the 1/f noise of the NMOS transistor or the PMOS transistor from different dies is sensitive to the frequency substantially at the same extent. However, distances of data points on the curves of the respective NMOS transistors relative to the x axis in FIG. 2, FIG. 3 and FIG. 4 are different, and distances of data points on the curves of the respective PMOS transistors relative to the x axis in FIG. 5, FIG. 6 and FIG. 7 are different. A distance relative to the x axis represents the 1/f noise at a certain frequency, and thus also reflects that the 1/f noise of the respective NMOS transistors or PMOS transistors at a certain frequency changes due to the process variation, as described previously. Therefore, the changes of these noise dependent upon the respective different NMOS transistors or PMOS transistors shall be reflected in a diagram, and a most straightforward method among the others is to determine a frequency, then select the 1/f noise of the NMOS transistors and the PMOS transistors corresponding to the frequency, and create a distribution diagram. Since the 1/f noise of the respective NMOS transistor in FIG. 2, FIG. 3 and FIG. 4 are sensitive to the frequency substantially at the same extent, and the 1/f noise of the respective PMOS transistor in FIG. 5, FIG. 6 and FIG. 7 are sensitive to the frequency substantially at the same extent, as described earlier, it can be considered that relative changes of the 1/f noise of the respective NMOS transistors or PMOS transistors at different frequencies are almost the same.

Figure 8:
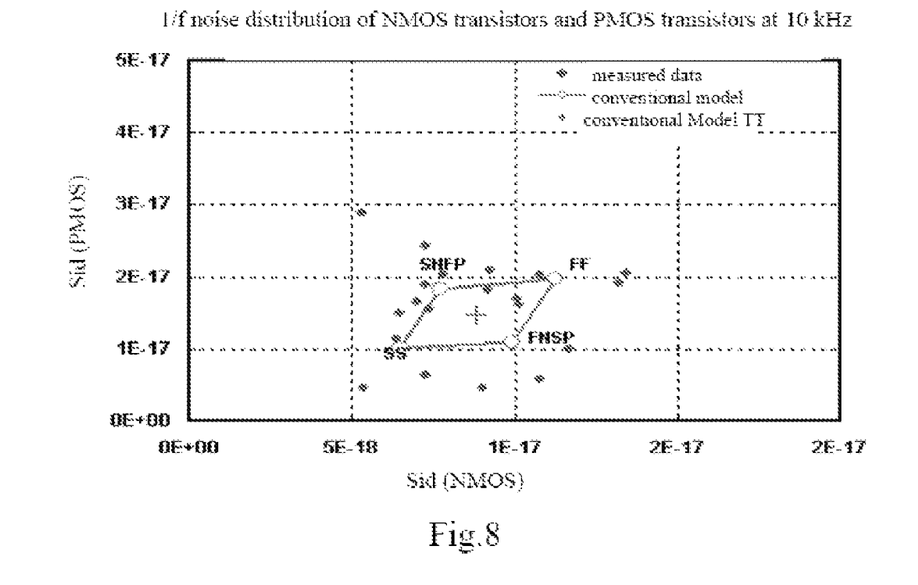
FIG. 8 is a graph showing the comparing result between simulation values of a conventional model and a 1/f noise distribution.

In this embodiment, the corresponding 1/f noise of the NMOS transistors and the PMOS transistors at a frequency of 10 kHz are selected, and with an abscissa indicating the 1/f noise of the NMOS transistors at a frequency of 10 kHz and an ordinate indicating the 1/f noise of the PMOS transistors at a frequency of 10 kHz, a distribution diagram of the 1/f noise in the MOS transistors at a frequency of 10 kHz is plotted, as illustrated in FIG. 8. Naturally, it is possible that the abscissa indicates the 1/f noise of the PMOS transistors, and the ordinate indicates the 1/f noise of the NMOS, but it has no influence on the distribution of the 1/f noise. Then, a simulation is performed with a conventional model, e.g. the BSIM3 model, and 1/f noise of four MOS transistors in s is obtained, respectively. The extreme situation are FF-fast NMOS and fast PMOS, SS-slow NMOS and slow PMOS, FNSP-fast NMOS and slow PMOS, and SNFP-slow NMOS and fast PMOS respectively. In accordance with the 1/f noise of four MOS transistors in extreme situations, a range within which the 1/f noise varies is determined as illustrated in FIG. 4. However, as can be seen from FIG. 8, the 1/f noise of the NMOS transistors and the PMOS transistors measured at a frequency of 10 kHz are beyond a range determined for four MOS transistors in extreme situations with the BSIM3 model. Therefore, the conventional BSIM3 model can not cover the data of the noise distribution diagram, and thus will not be precise sufficiently.

In step 3, a variation of at least one noise parameter in a noise model file is added into a library file of the MOS transistors in order for simulation of the noise of the MOS transistors. The reason why the BSIM3 model used in the embodiment can not cover the data of the noise distribution diagram is that a value set for a noise parameter in the model file is not accurate sufficiently. Therefore, in order to make the variation range determined for the four MOS transistors in extreme situations can cover the data of the noise distribution; a variation of a noise parameter in the library file of the MOS transistors needs to be set. Since the 1/f noise is often related to the process of an oxide layer, a relevant parameter for the process of the oxide layer may be adjusted. For instance, with respect to the BSIM3 model, it can be known from an analysis of a noise relationship in a noise model file that parameters related to the 1/f function include noia, noib, noic, em and ef The parameters noib and em are selected therefrom, and variations thereof are added into the library file and are initialized, and then the noise simulation is performed. As in step 2, through the simulation, the 1/f noise of four MOS transistors in extreme situations of FF, SS, FNSP and SNFP is obtained respectively. Since the distribution diagram of the 1/f noise is at a frequency of 10 kHz, a frequency at which the simulation of noise is performed is also set at 10 kHz.

In step 4, it is determined whether a simulation result can cover the noise data in the noise distribution diagram. With the 1/f noise of four MOS transistors in extreme situations of FF, SS, FNSP and SNFP at a frequency of 10 kHz as four vertexes, a range within which the 1/f noise varies at a frequency of 10 kHz is determined, and then is compared with the distribution diagram of the 1/f noise in the MOS transistors at a frequency of 10 kHz in order to check whether the variation range obtained from the simulation can cover the data in the noise distribution diagram.

In step 5, if the simulation result does not cover the data in the noise distribution diagram, then the variation of the noise parameter are changed continuously until the simulation result covers the data in the noise distribution diagram. In this embodiment, if the range determined for the 1/f noise of four MOS transistors in extreme situations of FF, SS, FNSP and SNFP, as simulated at a frequency of 10 kHz, can not cover the data in the 1/f noise distribution diagram of the MOS transistors at a frequency of 10 kHz, then the variations of noib and em in the library file are set again and the simulation is continued. For instance, some values of noib and em can be set to obtain simulated values in the situation of FF, so that it is possible to observe a trend of a simulated value in the situation of FF over the noise distribution diagram dependent upon different values of noib and em, thus finding values of noib and em, which is advantageous to cover the measured data in the situation of FF. Alike, the similar method can be adopted for the situations of SS, FNSP and SNFP to obtain corresponding values of noib and em.

Figure 9:
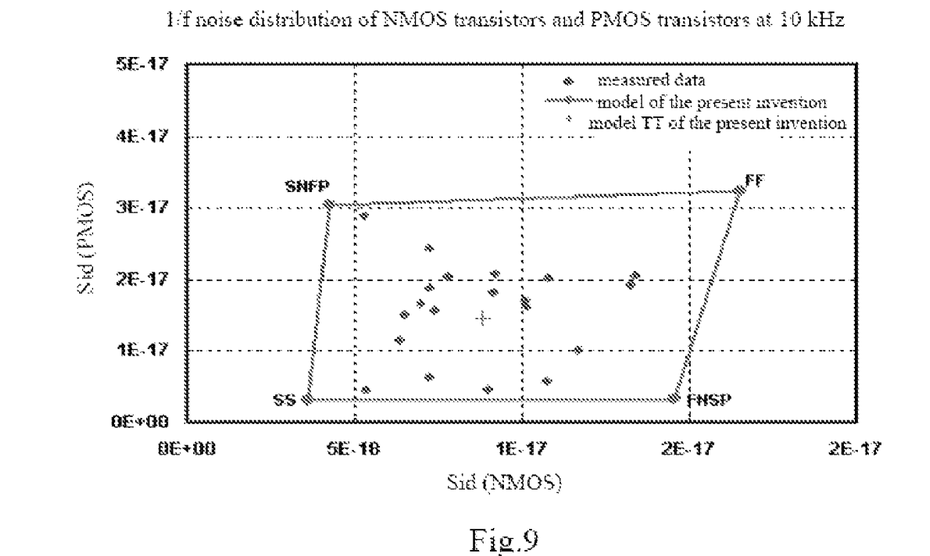
FIG. 9 is a graph showing the comparing result between simulation values of a model according to an embodiment of the present invention and a 1/f noise distribution.
Figure 10:
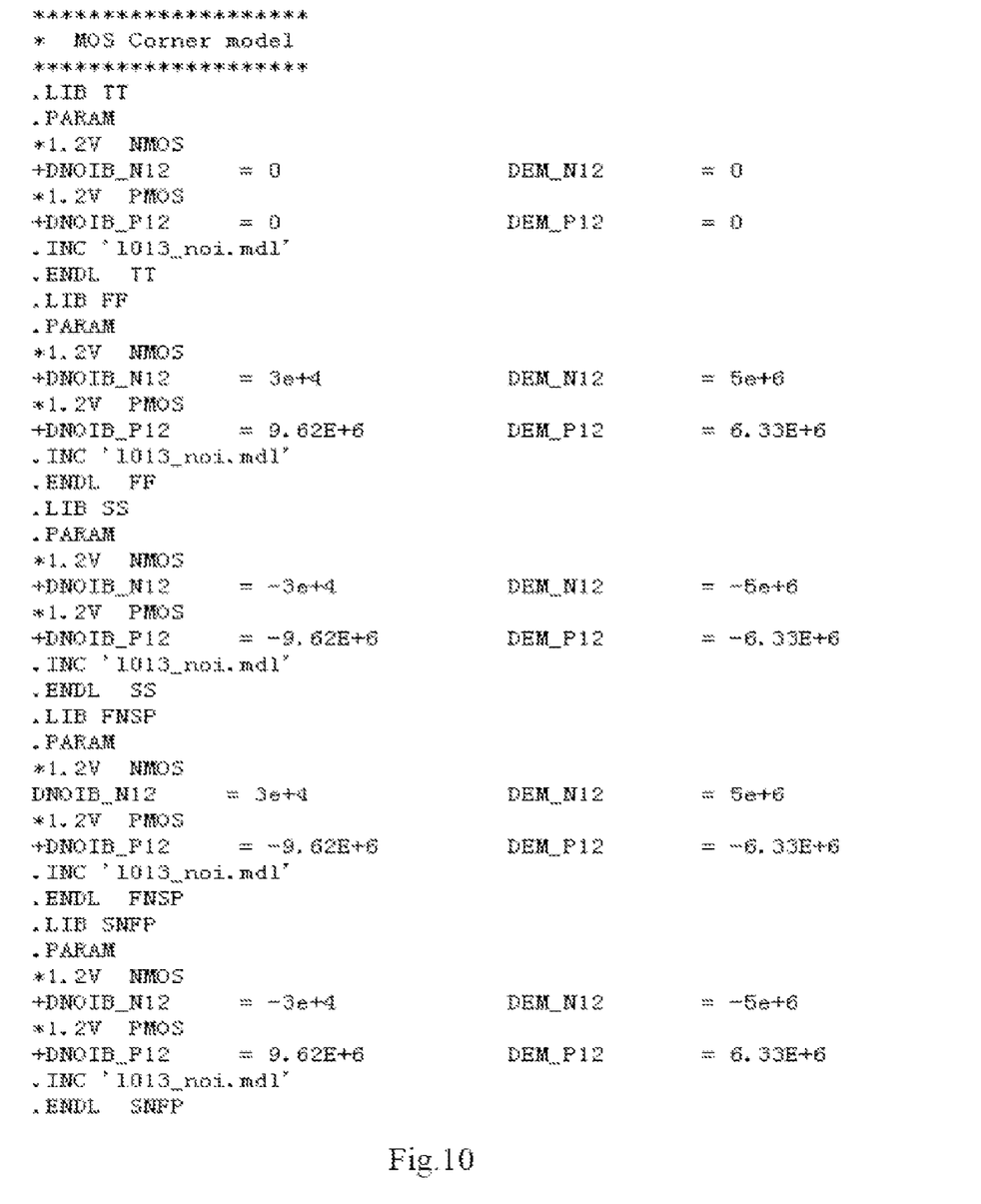
FIG. 10 is a library file of an MOS transistor model according to an embodiment of the present invention.

In step 6, if the simulation result can cover the data in the noise distribution diagram, then the corresponding noise variations are entered as an MOS transistor model enclosing statistical variation of noise into the library file of the MOS transistors. FIG. 9 shows the simulation result can cover the data in the noise distribution diagram. As can be seen from FIG. 9, the 1/f noise distribution data of the PMOS transistors and the NMOS transistors at a frequency of 10 kHz are totally within a quadrangle constructed by the vertexes which are the 1/f noise of four MOS transistors in extreme situations of FF, SS, FNSP and SNFP, as simulated by the model. Therefore, the variations of the noise parameters noib and em at this time can be entered into the BSIM3 model. At this time, the library file of the BSIM3 model is as illustrated in FIG. 10, wherein DNOIB_N12 and DEM_N12 in the library file are the variations of noib and em as added in the library file. FF, SS, FNP and SNFP are extreme situations of four MOS transistors as describe above.

Since the 1/f noise of the respective MOS transistors in FIG. 2 and FIG. 3 are sensitive to the frequency substantially at the same extent as described earlier, it can be considered that variation of the 1/f noise of the respective MOS transistors at different frequencies are almost the same. Consequently, this model can also be extended to an embodiment applicable to any frequency.

As can be seen from the above embodiments, the variations of the two parameters noib and em of the BSIM3 model are added so that the variation range resulted from the simulation result of the MOS transistors can cover the data in the noise distribution diagram. Naturally, methods for implementing such an object are not limited to this. As described earlier, during the measurement, different bias voltages may be set for the measurement of the noise, data at different frequencies may be selected during the creation of the distribution diagram, and noise parameters whose variations may be changed during the simulation are not limited to noib and em. The methods adopted in this embodiment are not only applicable to the BSIM3 model.

Therefore, the method used in this embodiment may also be applicable to other noise models such as SPICE2, BSIM4, etc. Based upon the above, the methods that can be adopted in this embodiment can also be extended other types of noise, such as modeling the thermal noise.

Furthermore, in the use of noise simulation to facilitate a design, the selection of a model that can simulate precisely a noise is important to the quality of the design. Therefore, a method that can verify a noise model will facilitate the design. A method for verifying an MOS transistor model enclosing statistical variation of noise according to the present invention is illustrated as in FIG. 11, including the following.

Figure 11:
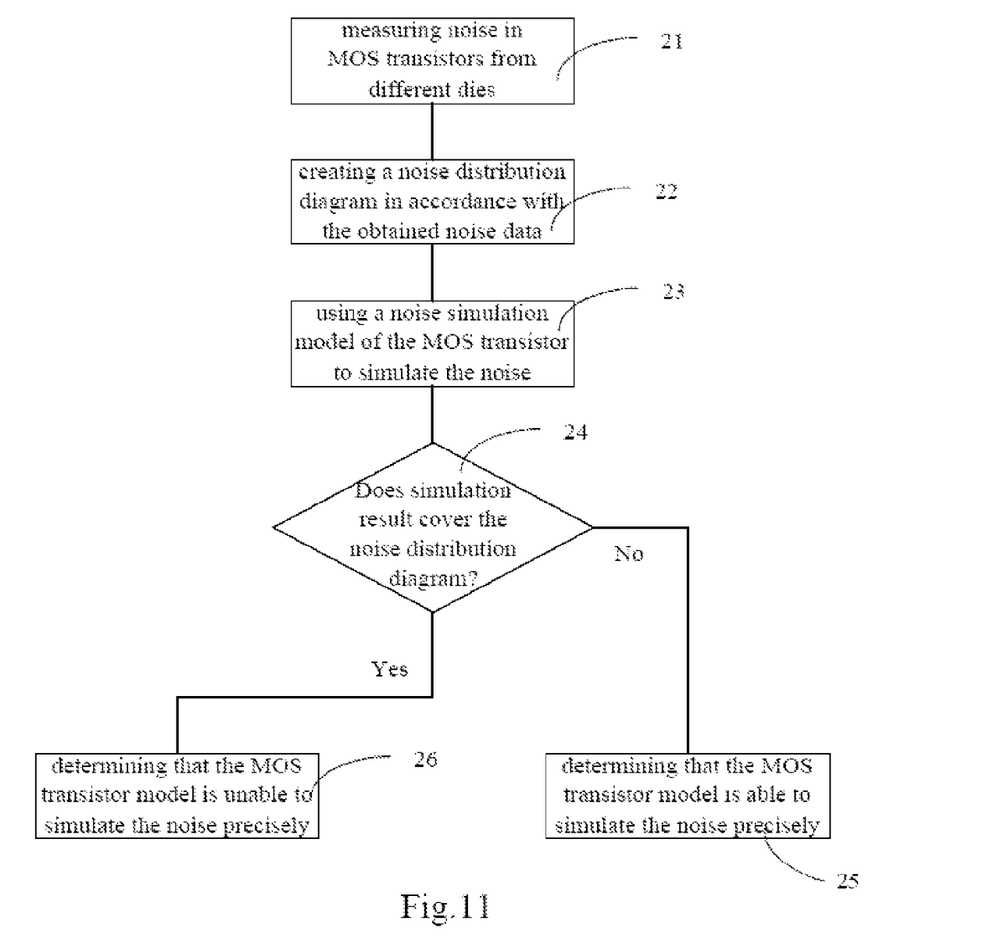
FIG. 11 is a flow chart showing a method for verifying an MOS transistor model according to the present invention.

In Step 21, noise in MOS transistors from different dies is measured. As described above, due to a variation of the process, MOS transistors from different dies on the same wafer may be different in their performances, let alone those on different wafers. Therefore, a benefit of the above selection of MOS transistors is to cover sufficiently the process variation, so that measured data can represent the discrete differences of MOS transistor performances. Thus, step 21 is actually to measure noise of NMOS transistors and PMOS transistors from different dies. There are various categories of noise, and each noise has a corresponding measurement method, as known by those skilled in the art. For instance, for the 1/f noise of an NMOS transistor, it is possible that when the NMOS transistor operates in the linear region or the saturated region, a fluctuation of the drain current in the NMOS transistor is measured at a frequency ranging from 4 Hz to 100 kHz to obtain the Sid of the NMOS transistor to indicate the 1/f noise.

At Step 22, a noise distribution diagram is created in accordance the obtained noise data of the MOS transistors. Through the method for building a noise distribution diagram as described above, in this step, with an ordinate indicating the measured noise data of the PMOS transistor and an abscissa indicating the measured noise data of the PMOS transistors, a noise distribution diagram of the NMOS transistors is created. Naturally, the abscissa may indicate the noise data of the PMOS transistor and the ordinate may indicate the noise data of the NMOS transistors, which has no influence on the distribution of the noise.

At Step 23, the noise in the MOS transistors is simulated with a library file of the MOS transistors containing a noise model file as a noise simulation model of the MOS transistors. As known by those skilled in the art, the MOS transistors are simulated with a conventional MOS transistor library file containing a noise model file in the condition of the noise measured in step 21, so that simulation data of the noise in the MOS transistors is obtained. Here, in order for efficient simulation, the noise in the MOS transistors are generally simulated in four extreme situations of FF-fast NMOS and fast PMOS, SS-slow NMOS and slow PMOS, FNSP-fast NMOS and slow PMOS, and SNFP-slow NMOS and fast PMOS.

At Step 24, whether the simulation result can cover the noise data in the noise distribution diagram is determined. With the measured noise data of four MOS transistors in extreme situations of FF, SS, FNSP and SNFP as four vertexes, a variation range of the noise is determined, and then is compared with the noise distribution diagram to check whether the variation range of the situation result can cover the data in the noise diagram distribution diagram.

In Step 25, it is determined that the MOS transistor model can not simulate precisely the noise if the simulation result does not cover the noise data in the noise distribution diagram. A quadrangle is obtained with the four vertexes of the simulation data of the noise in four extreme situations as obtained in step 23, and is used to check whether the noise data in the noise distribution diagram is covered. If the noise data in the noise distribution diagram is not covered, then it indicates that the simulation values of the noise model can not include the measured noise data, and hence the noise model is not precise.

In Step 26, it is determined that the MOS transistor model can simulate precisely the noise if the simulation result can cover the noise data in the noise distribution diagram. If the simulation result can cover the noise data in the noise distribution diagram, then it indicates that the simulation values of the noise model can include the measured noise data, that is, can cover the variation of the noise characters, and hence the noise model is precise sufficiently.

In summary, the method for building an MOS transistor model enclosing statistical variation of noise according to the present invention takes measured noise as original data, creates a distribution diagram for describing a statistical distribution of noise, and covers data in the noise distribution diagram with simulation values of the noise model, so that the built model can approach a realistic situation well and hence be more precise. The method for verifying an MOS transistor model according to the present invention takes measured noise of MOS transistors from different dies as original data, creates a distribution diagram for describing a statistical distribution of noise, considers differences of noise characters into, and takes the distribution diagram as a criteria for evaluating the precision of a noise model, so that the verifying method can be more accurate.

What is claimed is:

1. A method for building an MOS transistor model including a statistical variation of noise, comprising:
   measuring noise in MOS transistors from different dies, wherein the noise is a 1/f noise of PMOS transistors and NMOS transistors;
   creating a noise distribution diagram in accordance with the obtained noise data of the MOS transistors;
   adding a variation of a noise parameter in at least one noise model file into a library file of an MOS transistor to simulate noise in MOS transistors;
   if a simulation result does not cover the noise data in the noise distribution diagram, continuously changing the variation of the noise parameter until the simulation result covers the noise data in the noise distribution diagram, wherein the simulation result is a range determined with 1/f noise of four MOS transistors in extreme situations of FF, SS, FNSP and SNFP at a frequency as four vertices, wherein the simulation result does not cover the noise data in the noise distribution diagram when the noise data is not totally within a quadrangle constructed by the four vertices, wherein the continuously changing is made toward a trend to cover the noise data in the noise distribution diagram, and wherein FF is fast NMOS and fast PMOS, SS is slow NMOS and slow PMOS, FNSP is fast NMOS and slow PMOS, and SNFP is slow NMOS and fast PMOS ; and
   if the simulation result covers the noise data in the noise distribution diagram, adding a corresponding variation of the noise parameter into the library file of the MOS transistor as the MOS transistor model including a statistical variation of noise.

2. The method according to claim 1, wherein the 1/f noise is measured on the PMOS transistors or the NMOS transistors from different dies of different wafers.

3. The method according to claim 2, wherein the 1/f noise of the PMOS transistor or the NMOS transistor is measured at a frequency ranging from 4 Hz to 100 kHz.

4. The method according to claim 3, wherein the 1/f noise of the PMOS transistor or the NMOS transistor is measured in a linear region or a saturated region.

5. The method according to claim 4, wherein a drain current noise power spectral density of the PMOS transistor or the NMOS transistor is obtained by measuring a fluctuation of a drain current in the PMOS transistor or the NMOS transistor to indicate the 1/f noise of the PMOS transistor or the NMOS transistor.

6. The method according to claim 5, wherein the noise distribution diagram is created with an abscissa indicating the 1/f noise of the NMOS transistor and an ordinate indicating the 1/f noise of PMOS, or with the abscissa indicating the 1/f noise of the PMOS transistor and the ordinate indicating the 1/f noise of NMOS.

7. A method for verifying an MOS transistor model, comprising:
   measuring noise in MOS transistors from different dies, wherein the noise is a 1/f noise of PMOS transistors and NMOS transistors;
   creating a noise distribution diagram in accordance with the obtained noise data of the MOS transistors;
   using a library file of the MOS transistors, containing a noise model file, as a noise simulation model of the MOS transistors to simulate the noise;
   if a simulation result does not cover noise data in the noise distribution diagram, determining that the MOS transistor model is unable to simulate the noise, wherein the simulation result is a range determined with 1/f noise of four MOS transistors in extreme situations of FF, SS, FNSP and SNFP at a frequency as four vertices, wherein the simulation result does not cover the noise data in the noise distribution diagram when the noise data is not totally within a quadrangle constructed by the four vertices, and wherein FF is fast NMOS and fast PMOS, SS is slow NMOS and slow PMOS, FNSP is fast NMOS and slow PMOS, and SNFP is slow NMOS and fast PMOS; and
   if the simulation result covers the noise data in the noise distribution diagram, determining that the MOS transistor model is able to simulate the noise, the noise simulation model of the MOS transistors including a statistical variation of noise in the noise distribution diagram.

8. The method according to claim 7, wherein the 1/f noise is measured on the PMOS transistors or the NMOS transistors from different dies of different wafers.

9. The method according to claim 7, wherein the 1/f noise of the PMOS transistor or the NMOS transistor is measured at a frequency ranging from 4 Hz to 100 kHz.

10. The method according to claim 9, wherein the 1/f noise of the PMOS transistor or the NMOS transistor is measured in a linear region or a saturated region.

11. The method according to claim 10, wherein a drain current noise power spectral density of PMOS transistor or NMOS transistor is obtained by measuring a fluctuation of a drain current in the PMOS transistor or the NMOS transistor to indicate the 1/f noise of the PMOS transistor or the NMOS transistor.

12. The method according to claim 11, wherein the noise distribution diagram is created with an abscissa indicating the 1/f noise of the NMOS transistor and an ordinate indicating the 1/f noise of PMOS, or with the abscissa indicating the 1/f noise of the PMOS transistor and the ordinate indicating the 1/f noise of NMOS.

\* \* \* \* \*